United States Patent [19]

Cutchaw

[11] 3,874,768

[45] Apr. 1, 1975

[54] INTEGRATED CIRCUIT CONNECTOR

[76] Inventor: John M. Cutchaw, 7333 E. Virginia, Scottsdale, Ariz. 85257

[22] Filed: Mar. 11, 1974

[21] Appl. No.: 449,966

[52] U.S. Cl. .......................... 339/17 CF, 339/75 M

[51] Int. Cl. .......................... H05k 1/12

[58] Field of Search ........... 339/17 R, 17 A, 17 CF, 339/17 Q, 75 MP, 176 MP, 176 MF, 94 M; 317/101 CC, 101 CP

[56] References Cited

UNITED STATES PATENTS

| | | | |
|---|---|---|---|
| 3,335,327 | 8/1967 | Damon et al. | 339/17 CF X |
| 3,663,920 | 5/1972 | Lampham et al. | 339/17 CF |
| 3,719,917 | 3/1973 | Fischer et al. | 339/17 CF |
| 3,825,999 | 7/1974 | Rubey | 317/101 CC X |

*Primary Examiner*—Roy Lake
*Assistant Examiner*—E. F. Desmond
*Attorney, Agent, or Firm*—Herbert E. Haynes, Jr.

[57] ABSTRACT

A device for demountably connecting an integrated circuit package to a printed circuit board. The device employs a dual-contact spring element for connecting each lead of the package to the board by providing two signal paths for each interconnection.

10 Claims, 9 Drawing Figures

INTEGRATED CIRCUIT CONNECTOR

BACKGROUND OF THE INVENTION

1. Field of the Invention

This invention pertains to connectors and more particularly to a connector for removably mounting an integrated circuit package on a printed circuit board and providing reliable electrical interconnection therebetween.

2. Description of the Prior Art

The art of mounting an integrated circuit package on a printed circuit board has long been known to involve two basic design considerations. The first of these design considerations is to provide a reliable electrical connection, and the second is to mount the integrated circuit package so that it can be removed from the circuit board for maintenance and testing purposes.

Reliability of the electrical connection must be provided so that no air or moisture enters into the pores or irregularities of the metal to cause corrosion at the connection. This type of connection is sometimes referred to as a gas tight connection. If corrosion takes place, a decrease in signal strength will result due to an increase in the impedance of the connection, and in some instances complete failure of the connection may result.

The dense package arrays desirable in modern electronic equipment have increased the cost of individual circuit board assemblies to the point that stockpiling a spare of each type of board at the equipment installation site is very expensive. The current trend therefore, is to repair the board at the installation whenever possible. In the process of trouble shooting a printed wiring board assembly, it is often necessary to resort to the substitution method; that is, removal and replacement of one or more packages until the trouble has been corrected.

The well known solder technique is commonly employed for interconnection of integrated circuit packages to a printed board. While this technique provides very reliable gas tight electrical connections, it also makes assembly and removal of the package difficult due to the necessity of applying heat. The heat necessary to form the solder connection is quickly conducted through the leads into the integrated circuit package which may cause overheating thereof. Overheating can cause cracks in the glass seal and can cause delamination of the integrated circuit substrate. Heat also can warp and/or cause delamination of the printed circuit board. The application of heat is relatively easy to control during initial assembly of the circuit board under factory conditions. However, many costly elements and wiring board assemblies have been destroyed by the application of excessive heat at installation sites.

Due to the problems of replacement inherent with solder connections, many types of demountable connectors have been developed which do not require the use of heat in the formation of the electrical connections. These connectors employ what may be called pressure contacts for the formation of the electrical connections.

In general, the pressure contact type of demountable connectors generally employ a housing for mounting and properly registering the integrated circuit package on the circuit board. The housing is mounted to the circuit board in various ways, such as by screws. In some instances the housing is provided with a spring contact which interconnects the package lead with the mounting pad of the circuit board. This technique proved unreliable as it provided two possible points of failure for each lead of the package. The first point of failure was the contact between the spring and the lead of the package, and the second point of failure was the contact between the spring and the mounting pad of the circuit board. In another instance, the housing was provided with means for applying pressure directly to the lead of the package and forcing it into pressure contact with the mounting pad of the circuit board. This latter technique proved more reliable than the former technique, however, it still did not approach the reliability of the soldered connection.

From the foregoing, it may be seen that a need exists for a new and improved connector for mounting an integrated circuit package on a printed circuit board.

SUMMARY OF THE INVENTION

In accordance with the present invention, a device for interconnecting an integrated circuit package (I.C.) and a printed circuit board is disclosed. The device includes a housing into which the I.C. is nestably positioned. The housing containing the I.C. may be demountably secured to the printed circuit board such as by screws or the like. When mounted on the printed circuit board, the housing positions the I.C. so that the leads thereof registeringly contact the appropriate mounting pads or lands provided on the board. The underside of the housing is provided with a dual-contact spring element for each lead of the circuit package. Each of the dual-contact spring elements has the first end thereof which is in contact with the upper surface of the I.C. lead, and the second end which is in contact with the mounting pad of the circuit board. This arrangement provides a first signal path by virtue of the first end of the spring exerting a force which pressurizes the lead of the I.C. package directly into conductive contact with the mounting pad of the circuit board. A second signal path is provided through the spring element itself. This is accomplished by the first end of the spring element being in electrical contact with the I.C. lead, and the second end being in electrical contact with the mounting pad. Thus, it may be seen that in the event of failure of one or the other of the signal paths, the remaining signal path will insure continued operation of the integrated circuit package.

The housing of the present invention may be configured to receive any of the I.C. package designs in common usage, and may be designed to incorporate a heat dissipating element for those I.C. packages which create excessive heat.

Accordingly, an object of the present invention is to provide a new and useful device for interconnecting an integrated circuit package and a printed circuit board.

Another object of the present invention is to provide a new and useful device for demountably interconnecting an integrated circuit package and a printed circuit board.

Another object of the present invention is to provide a new and useful device for demountably interconnecting an integrated circuit package and a printed circuit board, said device being easily configured to accommodate any of the commonly employed integrated circuit package designs.

Another object of the present invention is to provide a new and useful device for demountably interconnecting an integrated circuit package and a printed circuit board, said device including a heat dissipating element.

Another object of the present invention is to provide a new and useful device for demountably interconnecting an integrated circuit package and a printed circuit board, said device including a dual-contact spring element for each lead of the integrated circuit package.

Still another object of the present invention is to provide a new and useful connector of the above described character in which each of the dual-contact spring elements thereof provide two signal paths for the electrical connections made thereby.

The foregoing and other objects of the present invention, as well as the invention itself, may be more fully understood when read in conjunction with the accompanying drawings.

DESCRIPTION OF THE PREFERRED EMBODIMENT

Figures 1, 2, 3:
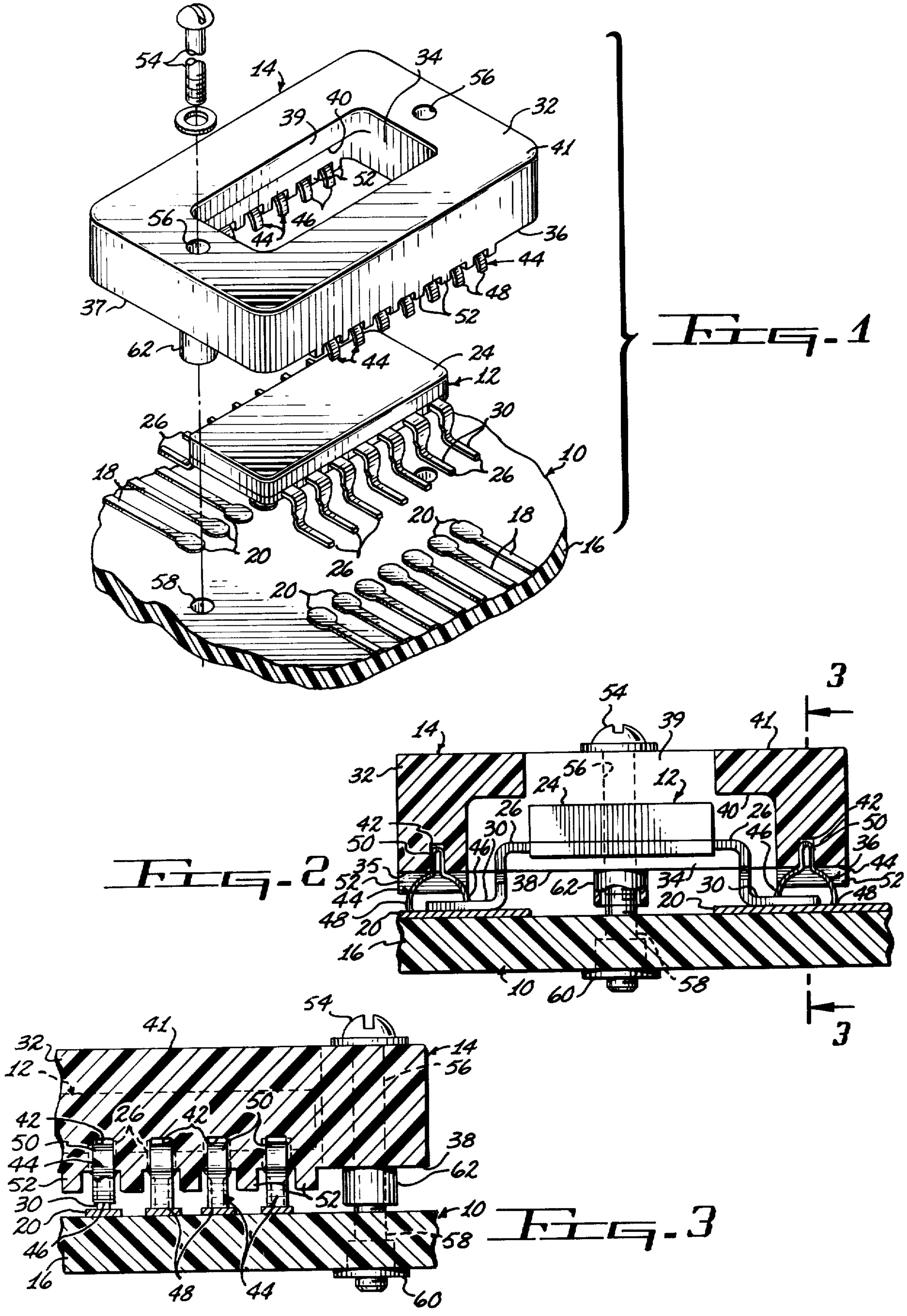
FIG. 1 is an isometric exploded view showing a fragmentary portion of a printed circuit board having one form of integrated circuit package and the connector of the present invention exploded therefrom.
FIG. 2 is an enlarged sectional view of the circuit board having the integrated circuit package mounted thereon by the connector of the present invention.
FIG. 3 is a sectional view taken on the line 3—3 of FIG. 2.

Referring more particularly to the drawings, FIG. 1 shows an isometric view of a portion of a printed wiring board 10 having an integrated circuit 12, and a connector device 14 of the present invention exploded therefrom.

The printed circuit board is shown for illustrated purposes only, and as is well known in the art includes an insulative substrate 16 having wire runs 18 and mounting pads 20 or lands provided in the well known manner on the surface thereof.

The integrated circuit 12 is of the type commonly referred to as a dual in line package (D.I.P.). The standard D.I.P. integrated circuit 12 comprises a body 24 which contains miniaturized circuitry. Electrical contact to the internal circuitry is made through a plurality of leads or prongs 26 extending laterally from the sides of the body 24. The prongs 26 extend from the body 24 a short distance and are formed to approximately a 90° angle to provide a prong contact area 30. To accommodate the mounting technique of the present invention, the leads 26 extend downwardly from the 90° bend a short distance and are then formed into a second 90° bend so that the prong contact areas 30 are downwardly offset from the body 24 and extend laterally outwardly from the opposite sides thereof.

The connector 14 is provided with a housing 32 which may be formed as by casting, molding, and the like, from any suitable high quality dielectric material having good dimensional stability and low coefficient of thermal expansion such as polycarbonate, polypropylene, and alloyed synthetic materials.

When the housing 32 is designed to accommodate the DIP type of integrated circuit 12, as previously described, the geometric configuration of the housing is preferably rectangular as best seen in FIG. 1 of the drawings.

The housing 32 has a rectangular cavity 34 formed therein which is recessed upwardly from the bottom of the housing. Thus, the bottom of the housing 32 is formed with a pair of opposed downwardly facing side surfaces 35 and 36 and a pair of opposed downwardly facing end surfaces 37 and 38.

The cavity 34 is provided with length, width and depth dimensions of sufficient magnitude so that the body 24 of the integrated circuit 12 may be nestably positioned therein with the leads 26 protruding below the bottom of the housing 32 and the lead contact areas 30 of the leads are positioned transverse with respect to the side surfaces 35 and 36.

It should be noted that the interior configuration of the cavity 34 is shown as being quite large when compared with the physical size of the body 24 of the integrated circuit 12. It is contemplated that mounting of the integrated circuit 12 will be accomplished by placing the integrated circuit 12 upon the circuit board 10 in the proper position and then assemblying the connector 14 to the board as will be described. Should it be desired to insure proper registry of the integrated circuit 12 with respect to the circuit board 10, the cavity 34 may be formed to engagingly contact the body 24 to precisely position the integrated circuit 12 within the connector 14. Thus, proper registry of the integrated circuit 12 would automatically be accomplished when the connector 14 containing the integrated circuit 12 is mounted on the board.

The housing 32 may be formed with an aperture 39 which communicates between the recessed surface 40 of the cavity 34 and the upper surface 41 of the housing 32. This aperture 39 may be formed in the housing 32 when dissipation of heat generated by the integrated circuit 12 is desirable. Otherwise, the aperture 39 may be omitted thus allowing the housing 32 to be formed into a structure which would seal the integrated circuit 12 from its environment as will be hereinafter described in detail.

Each of the downwardly facing side surfaces 35 and 36 have a plurality of apertures 42 formed therein in spaced increments along the length thereof. Each of the apertures 42 extend upwardly into the housing 32 as seen best in FIG. 2. The number of apertures 42 formed on each of the side surfaces 35 and 36 is determined by the number of leads 26 of the integrated circuit 12 and the distance between centers of the leads.

A dual-contact spring element 44 is mounted within each of the apertures 42 to provide the electrical interconnections between the leads 26 of the integrated circuit 12 and the mounting pads 20 of the circuit board 10.

The spring elements 44 may be fabricated of copper plated spring steel, beryllium copper, phosphor bronze, or the like and may be gold plated to avoid difficulties due to corrosion and to assure low resistive electrical connections. As seen in FIGS. 2 and 3 the spring elements are in thin ribbons or strips which are formed into a substantially semicircular configuration to provide contact points 46 and 48 at the opposite ends thereof. Intermediate the contact points 46 and 48, the spring element 44 is formed with a radially extending loop 50. It will be seen, particularly in FIG. 2, that the loop 50 is somewhat offset from the midpoint between the contact points 46 and 48 to form the arcuate leg between the loop 50 and point 46 shorter than the arcuate leg between the loop 50 and the contact point 48. The amount of this offset is determined by the thickness dimension of the leads 26 of the integrated circuit 12 and is necessary to place the contact point 46 above the contact point 48 to insure proper contact with the lead 26 and the mounting pad 20 as will be described in detail.

The spring elements 44 are mounted to the housing 32 by inserting the loops 50 into the apertures 42. Due to the resiliancy of the material employed in forming the elements 44 and the physical shape of the loops 50, the elements 44 will be held in place by the spring force exerted on the walls of the apertures 42 by the loops 50.

As best seen in FIG. 3 a depending divider 52 is formed on the housing 32 between each of the apertures 42. The dividers 52 are provided to insure that twisting, bending or other deformation of the spring elements 44 will not result in electrical shorting between adjacent elements 44.

The width dimension of the spring elements 44 is selected to be larger than the width dimension of the contact areas 30 of the leads 26 of the integrated circuit 12. This dimensional difference compensates for bent or other misaligned leads 26 which may result due to the delicate nature of the leads.

The connector 14 is preferably attached to the circuit board 10 by means of screws 54 which pass through apertures 56 formed in the housing 32 and enter into aligned apertures 58 formed in the circuit board 10. Captive nuts 60 are provided on the board 10 for being threadingly engaged by the screws 54. Although only two screws 54 are illustrated in the drawings, it should be understood that four could be employed with one located at each of the corners of the housing 32. It should also be noted that the exact arrangement of the screws 54 and nuts 60 is not critical as the captive nuts could just as easily be mounted in the housing 32 which would therefore necessitate inserting the screws from the opposite side of the circuit board.

Stop means 62 are dependingly formed on the housing 32 to prevent the screws 54 from pulling the housing too close to the surface of the circuit board 10 which could overstress the spring elements 44 should this be allowed to occur. The stop means 62 are illustrated as boss like structures through which the screws 54 pass; however, it should be apparent that any type of depending structure would be a functional equivalent such as solid bosses (not shown) formed at each of the bottom corners of the housing 32.

Each of the spring elements 44 form a dual signal path interconnection between the leads 26 and the mounting pads 20. The first signal path is formed by contiguous contact between the bottom surface of the lead 26 and the upper surface of the mounting pad 20. This first signal path connection is of the pressure contact type with the necessary pressure being supplied by a downwardly directed force exerted by the spring element 44 pushing the contact point 46 downwardly. The second signal path is through the spring element 44 itself which makes the necessary conductive contacts by virtue of point 46 engaging the lead 26 and point 48 directly contacting the same mounting pad 20.

It will be noted that with the integrated circuit 12 mounted within the housing 21 as previously described the integrated circuit 12 is mechanically retained only by pressure of the spring elements 44 on the leads 26. Thus, vibrations of the circuit board, thermal expansion and the like will cause relative movements to occur within controlled limits, such limits being imposed by the interior dimensions of the cavity 34. These controlled movements will cause a wiping action to occur between the contacting surfaces thus providing self-cleaning points of contact.

In view of the foregoing features of self-cleaning contacts and dual-signal paths, it should be readily apparent that the connector 14 of the present invention has provided means for removably mounting integrated circuit packages to printed circuit boards with electrical interconnections having a reliability approaching that of the conventional soldered connections.

Figure 4:
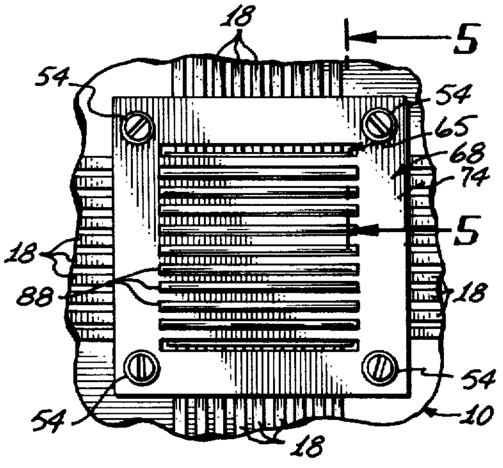
FIG. 4 is a fragmentary plan view of a printed circuit board having a second embodiment of the connector of the present invention mounted thereon.
Figure 5:
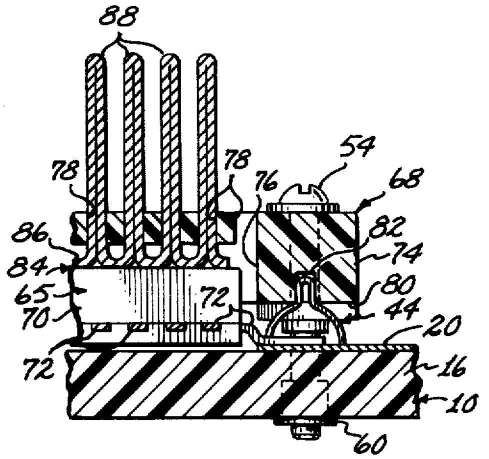
FIG. 5 is an enlarged fragmentary sectional view taken on the line 5—5 of FIG. 4.

With reference now to FIGS. 4 and 5 wherein an integrated circuit 65 of a type differing from the DIP previously described, is shown mounted to the circuit board 10 by means of a modified connector 68 of the present invention.

The integrated circuit 65 is shown as being of the type sometimes referred to as a 2 × 2 ceramic substrate which comprises hybrid combinations of integrated microcircuits and discrete circuitry such as thin and thick films.

It should be noted that it is not intended to limit the scope of the present invention to specific types or sizes of integrated circuit packages. The specific integrated circuits shown and described herein were selected merely for descriptive purposes as it is contemplated that the connector of the present invention can be configured to accommodate various integrated circuit packages without deviation from the principles of the invention.

The integrated circuit 65 comprises a body 70 of generally square configuration from each side of which extends the leads 72 which provide electrical contact with the internal circuitry (not shown) of the integrated circuit 65.

To accommodate the integrated circuit 65 having the physical properties previously described, the connector 68 is provided with a housing 74 of generally square configuration and of the same type material previously described with reference to the housing 32 of connector 14. The housing is formed with a square cavity 76 formed therein to extend upwardly from the bottom of the housing. A plurality of parallel elongated slots 78 are formed in the housing 74 to extend from the upper surface of the housing downwardly into the cavity 76.

Each of the downwardly facing surfaces 80 (one shown), which form the bottom of the housing 74, has a plurality of apertures 82 formed therein in spaced increments along the length. As before, the number of the apertures and the spacing thereof is determined by the number of leads 72 and the spacing between the leads.

A dual-contact spring element 44 is mounted within each of the apertures 82 and provides the same type of dual signal path as hereinabefore described with reference to connector 14.

Integrated circuits 65 generally have a greater amount of heat build up than the DIP type integrated circuit 12 and therefore heat dissipation is much more critical in the mounting of the integrated circuit 65. As seen best in FIG. 5 a heat sink 84 may be employed in conjunction with the connector 68 for dissipation of heat. The heat sink 84 is preferably of metallic construction and comprises a flat plate 86 which is in contiguous contact with the upper surface of the integrated circuit. A plurality of parallel upstanding fins 88 are integrally formed on the upper surface of the plate 86. The fins 88 are spaced apart with respect to each other a distance which corresponds to the spacing of the slots 78 of the housing 74. Each of the fins 88 are positioned to pass through their respectively aligned slots 78 and extend upwardly therefrom. Thus, heat generated by the integrated circuit 65 will be conducted through the plate 86 upwardly to the fins 88 which will dissipate the heat by convection and radiation. It is preferred that the dimensions of the slots 78 and the fins 88 are such that the fins are free to slide within the slots to insure that the plate 86 will be held in contiguous contact with the upper surface of the integrated circuit. To insure efficient transfer of heat a silicone grease, which is well known to be a good heat conductor, may be applied to the mating surfaces of the plate 86 and the integrated circuit.

Figure 6:
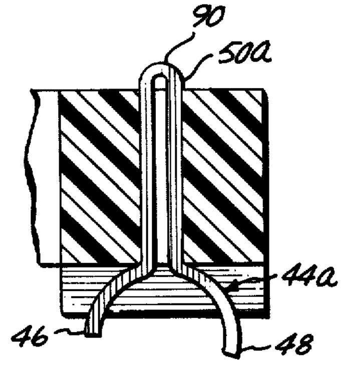
FIG. 6 is an enlarged fragmentary view of the connector of the present invention showing a first modification thereof.
Figure 7:
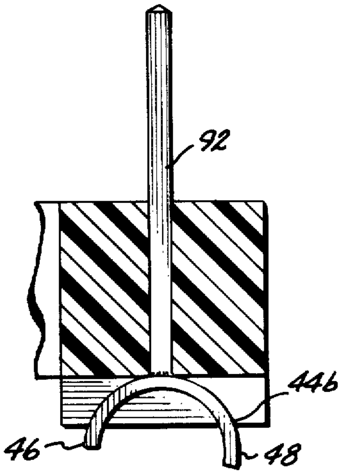
FIG. 7 is a view similar to FIG. 6 showing another modification.

Reference is now made to FIGS. 6 and 7 wherein two modifications of the spring element 44 are illustrated. The spring element 44*a* of FIG. 6 is shown to include an elongated loop portion 50*a* which passes upwardly through the aperture of the housing to provide an end 90 which extends thereabove. The extending end 90 provides an exposed surface for facilitating application of test probes (not shown). The spring element 44*b* of FIG. 7 is illustrated as being formed with a wire wrap pin 92 in place of the loop 50. The pin 92 will provide an exposed test probe surface and also facilitate the use of well known wire wrapping techniques.

Figure 8:
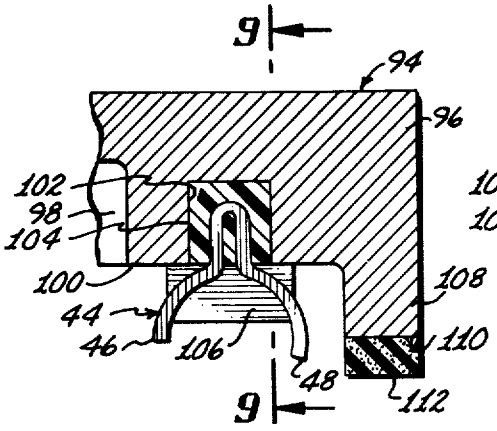
FIG. 8 is an enlarged view of a portion of the connector of the present invention showing still further modifications thereto.
Figure 9:
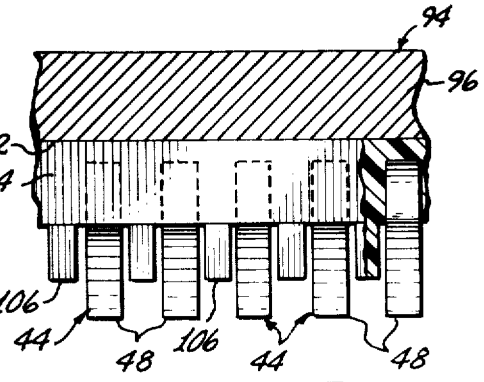
FIG. 9 is a fragmentary sectional view taken on the line 9—9 of FIG. 8.

FIGS. 8 and 9 illustrate a modification of the construction details which may be applied to either of the connectors 14 and 68, and also illustrate an additional feature which may be incorporated therein.

The connector 94 illustrated in FIGS. 8 and 9 includes a housing 96 having a cavity 98 both of which may be geometrically configured to accommodate integrated circuits of various sizes and shapes as previously described. The housing 96 is of metallic construction for improved heat dissipation and is provided with downwardly facing bottom surfaces 100 (one shown) similar to those previously described with the exception that surfaces 100 are each provided with an elongated downwardly opening channel 102 formed therein. An elongated strip 104 of insulative material having a plurality of the dual-contact spring elements 44 molded or otherwise mounted thereto in spaced increments is inserted within each of the channels 102 and may be retained therein in any of several well known manners such as with suitable adhesive. The insulative strips 104 may be provided with depending dividers 106 between each of the spring elements 44 for the purposes previously described.

Should it be desired that an integrated circuit be sealed for prevention of contamination from dust, moisture and the like, the housing 96 may be provided with an endless depending lip 108 integrally formed on the outermost edges of the bottom surfaces 100. The lip 108 depends a distance that will position its lowermost surface 110 above the surface of the circuit board. An endless sealing gasket 112 is attached such as with suitable adhesive to the lower surface 110 of the lip 108 which will sealingly engage the circuit board when the connector 94 is mounted thereon. The gasket 112 is of resilient material such as sponge rubber.

While the principles of the invention have now been made clear in an illustrated embodiment, there will be immediately obvious to those skilled in the art, many modifications of structure, arrangements, proportions, the elements, materials, and components used in the practice of the invention, and otherwise, which are particularly adapted for specific environments and operation requirements without departing from those principles. The appended claims are therefore intended to cover and embrace any such modifications within the limits only of the true spirit and scope of the invention.

What I claim is:

1. A connector for removably mounting a multilead integrated circuit to a printed wiring board and providing electrical interconnection between the leads of the integrated circuit and conductive elements of the circuit board, said connector comprising:

a. a housing for demountable attachment to the printed wiring board, said housing having a downwardly opening cavity formed therein into which the integrated circuit is nestingly positionable, said housing having downwardly facing bottom surfaces extending laterally from the opening of said cavity below at least an opposed pair of which the leads of the integrated circuit are transversely disposed when the integrated circuit is positioned within the cavity of said housing; and b. a plurality of dual-contact spring elements dependingly suspended from at least each of the opposed pair of bottom surfaces of said housing for electrically contacting the leads of the integrated circuit and exerting a downwardly directed force thereon when the integrated circuit is positioned within the cavity of said housing, and for electrically contacting the conductive elements of the printed circuit board when said housing is mounted thereon.

2. A connector as claimed in claim 1 wherein said housing is formed of dielectric material and has a plurality of apertures positioned along the length of at least each of the opposed pair of bottom surfaces of said housing and formed to extend upwardly therefrom for dependingly suspending one of said dual-contact spring elements from each of said apertures.

3. A connector as claimed in claim 1 wherein said housing has an aperture formed therein to extend downwardly from the upper surface and open into the cavity thereof.

4. A connector as claimed in claim 1 wherein each of said dual-contact spring elements is a strip of electrically conductive material formed into a substantially semicircular configuration to provide a first contact end and a second contact end and having a radially extending loop substantially intermediate the first and second contact ends.

5. A connector as claimed in claim 1 wherein each of said dual-contact spring elements is a strip of electrically conductive material formed into a semicircular configuration to provide a first contact end and a second contact end between which a radially extending protrusion is provided, said protrusion being insertable within an upwardly extending aperture formed in the bottom surface of said housing for mounting said dual-contact spring element thereto.

6. A connector as claimed in claim 5 wherein said radially extending protrusion comprises a loop formed in said strip of material, said loop being of sufficient elongation to extend upwardly from the bottom surface of said housing and be exposed adjacent to the upper surface of said housing.

7. A connector as claimed in claim 5 wherein said radially extending protrusion comprises a wire-wrapping pin attached to said strip of material and of elongated dimension to extend upwardly from the bottom surface of said housing to a location above the upper surface of said housing.

8. A connector as claimed in claim 1 wherein said housing is provided with a plurality of parallel elongated slots formed in the upper surface thereof and extending downwardly into the cavity of said housing.

9. A connector as claimed in claim 1 wherein said housing is provided with an endless depending lip integrally formed on the outermost edges of the bottom surfaces of said housing, said depending lip having a lowermost end upon which a sealing gasket is affixed.

10. A connector as claimed in claim 1 wherein said housing is formed of metallic material and at least the opposed pair of the bottom surfaces thereof are each formed with an elongated downwardly opening channel for receiving an elongated strip of insulative material from which a plurality of said dual-contact spring elements are dependingly suspended in spaced increments along the length thereof.

* * * * *